United States Patent [19]
Hiltebeitel et al.

[11] Patent Number: 5,430,679
[45] Date of Patent: Jul. 4, 1995

[54] FLEXIBLE REDUNDANCY ARCHITECTURE AND FUSE DOWNLOAD SCHEME

[75] Inventors: Nathan R. Hiltebeitel, Essex Junction; Dale E. Pontius, Colchester; Steven W. Tomashot, Jericho, all of Vt.

[73] Assignee: International Business Machines Corporation, Armonk, N.Y.

[21] Appl. No.: 119,797

[22] Filed: Sep. 10, 1993

Related U.S. Application Data

[63] Continuation of Ser. No. 630,930, Dec. 20, 1990, abandoned.

[51] Int. Cl.⁶ .............................................. G11C 7/00
[52] U.S. Cl. ................................. 365/200; 365/225.7
[58] Field of Search .............. 365/200, 189.02, 230.03, 365/230.02, 225.7

[56] References Cited

U.S. PATENT DOCUMENTS

| | | | |
|---|---|---|---|
| 3,755,791 | 8/1973 | Arzubi | 340/173 R |
| 4,532,607 | 6/1985 | Uchida | 365/96 |
| 4,614,881 | 9/1986 | Yoshida et al. | 307/219 |
| 4,639,897 | 1/1987 | Wacyk | 365/200 |
| 4,720,817 | 1/1988 | Childers | 365/200 |
| 4,862,416 | 8/1989 | Takeuchi | 365/200 X |
| 4,885,721 | 12/1989 | Katanosaka | 365/200 X |
| 4,947,375 | 8/1990 | Gaultier et al. | 365/200 |
| 5,046,046 | 9/1991 | Sweha et al. | 365/200 |
| 5,053,999 | 10/1991 | Matsumura | 365/200 |
| 5,058,059 | 10/1991 | Matsuo et al. | 365/200 X |
| 5,058,069 | 10/1991 | Gaultier et al. | 365/200 |
| 5,060,197 | 10/1991 | Park et al. | 365/200 |

FOREIGN PATENT DOCUMENTS

| | | |
|---|---|---|
| 0049629 | 4/1982 | European Pat. Off. |
| 0083031 | 7/1983 | European Pat. Off. |
| 0282384 | 9/1988 | European Pat. Off. |

OTHER PUBLICATIONS

"Semiconductor Memory Redundancy at the Module Level," B. F. Fitzgerald et al., vol. 23, No. 8 Jan. 1981 IBM TDB, pp. 3601–3602.

"Fault-Tolerant Memory Chip Architecture for Yield Enhancement and Field Repair," S. Singh et al., vol. 26, No. 1, Jun. 1983, IBM TDB, pp. 342–343.

"Efficient Use of Redundant Bit Lines for Yield Optimization," N. Hiltebeitel et al., vol. 31, No. 12, May 1989 IBM TDB, pp. 107-8.

"Volatile Redundancy Fuse Selection and Read Back," H. L. Kalter et al., vol. 32, No. 6B, Nov. 1989 IBM TDB, pp. 450–451.

*Primary Examiner*—Joseph A. Popek
*Assistant Examiner*—Son Dinh
*Attorney, Agent, or Firm*—Howard J. Walter, Jr.

[57] ABSTRACT

A fuse download system for programming decoders for redundancy. Auxiliary fuse banks have sets of fuses that store logic states that (a) select a redundant decoder and (b) indicate the address of a faulty row/column of memory cells. When the chip is first powered up, each set of fuses is accessed and downloaded to program selected redundant decoders. Because the fuse sets can be dynamically assigned to redundant decoders on an any-for-any basis, the fault tolerance of the redundancy system is enhanced.

11 Claims, 7 Drawing Sheets

FLEXIBLE REDUNDANCY ARCHITECTURE AND FUSE DOWNLOAD SCHEME

This application is a continuation of Ser. No. 07/630,930 filed on Dec. 20, 1990, now abandoned.

BACKGROUND OF THE INVENTION

1. Technical Field

The invention relates generally to a redundancy system for semiconductor devices, and more particularly to a redundancy architecture that enhances yield while decreasing access delays.

2. Background Art

Since the early 1970's, redundancy has been used to substitute spare rows/columns of memory cells for faulty rows/columns of cells in a memory array. In such systems, the memory is tested after manufacture and before encapsulation to detect faulty rows/columns. The addresses of these faulty lines are set in polysilicon fuses, using laser and/or electrical fuse blow techniques. Each redundant address decoder has its own dedicated set of fuses. The redundant decoders receive incoming row/column address signals, and compare these signals to the addresses stored in the fuses. If a match occurs, the redundant row/column associated with the particular redundant decoder is accessed, and the memory row/column is disabled such that data is read from and/or written to the redundant row/column.

In addition to fuses, other non-volatile storage means have been used to store the address of a faulty row/column. U.S. Pat. No. 3,755,791, entitled "Memory System With Temporary Or Permanent Substitution Of Cells For Defective Cells," issued to Arzubi and assigned to IBM, teaches the use of a latch made up of non-volatile devices such as MNOS transistors. An article by Fitzgerald et al, "Semiconductor Memory Redundancy At The Module Level," *IBM Technical Disclosure Bulletin*, Vol. 23, No. 8, January 1981 pp. 3601–02 teaches the use of FAMOS devices. In both references, non-volatile storage is emphasized because such cells can be programmed after the memory is packaged and sold to the customer. In other words, because the redundancy data can be updated after chip encapsulation, redundancy can be programmed at the module level to correct bits that fail in the field.

Another alternative that has developed is the use of fuses that provide inputs to latches. Under the control of clock signals, the fuses are interrogated, and the data therefrom is used to set the state of static latches. The latched data can now be updated in the field, without losing the original redundancy data stored in the fuses. Examples of such arrangements include U.S. Pat. No. 4,532,607, entitled "Programmable Circuit Including A Latch To Store A Fuse's State," issued to Uchida and assigned to Toshiba; U.S. Pat. No. 4,614,881, entitled "Integrated Semiconductor Circuit Device For Generating A Switching Control Signal Using A Flip-Flop Circuit Including CMOS FET's And Flip-Flop Setting Means," issued to Yoshida et al. and assigned to Fujitsu; and the article "Volatile Redundancy Fuse Selection And Read Back," *IBM Technical Disclosure Bulletin*, Vol. 32, No. 6B, November 1989 pp. 450–51. See also an article by Singh et al, "Fault-Tolerant Memory Chip Architecture For Yield Enhancement And Field Repair," *IBM Technical Disclosure Bulletin*, Vol. 26, No. 1, June 1983 pp. 342–43, wherein the redundant address is stored in a shift register dedicated to fix field fails.

In general, the number of row/column lines in memory chips doubles with each generation. While there have been some attempts in the art to reduce the number of redundant rows/columns while retaining the same potential fault coverage (e.g. by sharing redundant elements between adjacent arrays—see the article "Efficient Use Of Redundant Bit Lines For Yield Optimization," *IBM Technical Disclosure Bulletin*, Vol. 31, No. 12, May 1989 pp. 107–08), the industry practice has been to increase the number of redundant bits in direct proportion to the increase in the number of data bits stored by the memory. The increased density/complexity of the overall redundancy system provides an increased likelihood of faults.

For example, since each redundant address decoder has its own dedicated set of fuses, this means that the number of fuses doubles each generation. As the number of fuses increases, so does the extent to which fuse operations detract from overall yield. For example, if laser-blown fuses are used, as the number of fuses increases the likelihood that a given fuse will be partially blown (by virtue of misalignment between the laser spot and the fuse to be blown) also increases, thus setting an incorrect address in the redundant address decoder and permitting access to a faulty line of cells. Since faulty memory cells already sharply limit yield, the overall process yield is extremely intolerant to non-cell yield detractors such as faulty fuse blow.

SUMMARY OF THE INVENTION

It is thus an object of the invention to reduce the impact of fuse operations on overall memory chip yield.

It is also an object of the invention to reduce the impact of fuse operations on overall yield without decreasing the fault recovery capability of the memory chip.

It is a further object of the invention to provide an efficient redundancy architecture that minimizes the access delays inherent in redundancy operations.

The foregoing and other objects of the invention are realized by an integrated circuit, comprising:
  a first plurality of circuit elements, each activated by a specific selection signal and designed to provide a given circuit function;
  a plurality of redundant circuit elements, at least one of said plurality of redundant circuit elements to be substituted for a faulty one of said first plurality of circuit elements; and
  first means for storing a representation of said specific selection signal for said faulty one of said first plurality of circuit elements and for storing signals indicating which of said plurality of redundant circuit elements is to be substituted for said faulty one of said first plurality of circuit elements.

BRIEF DESCRIPTION OF THE DRAWING

The foregoing and other structures and teachings of the present invention will become apparent upon review of the description of the best mode for carrying out the invention as rendered below. In the description to follow, reference will be made to the accompanying Drawing, in which.

DESCRIPTION OF THE BEST MODE FOR CARRYING OUT THE INVENTION

Figure 1:
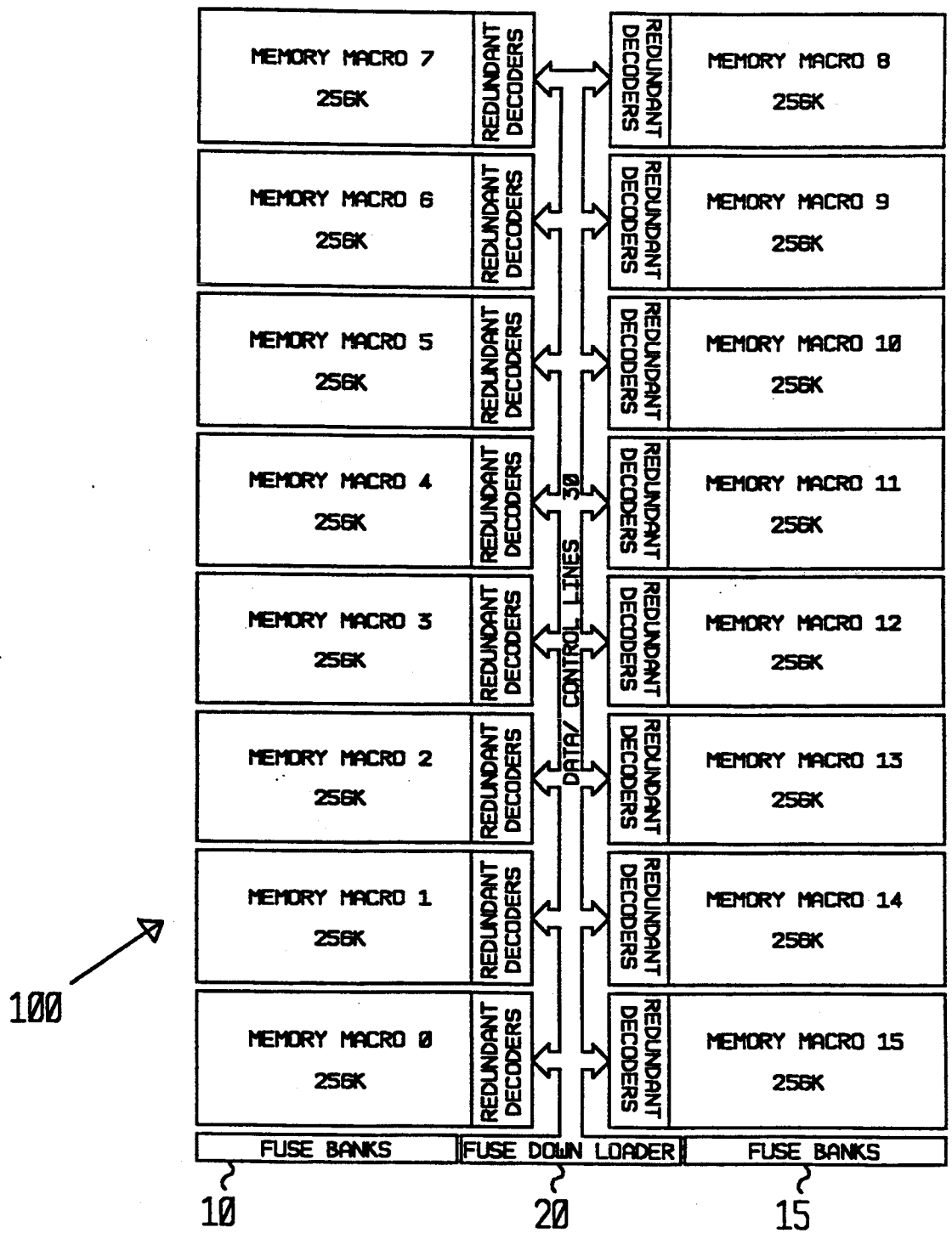
FIG. 1 is a block diagram of a memory chip that embodies the fuse download system of the invention.

FIG. 1 is a block diagram of the fuse download system for a chip 100. While the invention will be discussed hereafter with reference to use for fault recovery in a memory system, it is to be understood that chip 100 could be a logic chip, wherein logic interconnections can be reallocated to spare logic circuitry.

Chip 100 has sixteen 256K memory arrays (MEMORY MACROS 0-15) thereon, each with its own set of redundant decoders. While the redundant decoders are discussed in the context of "sets" of decoders for each array, in practice each array could have only one redundant decoder. Each redundant decoder drives a redundant row/column of memory cells arranged within the corresponding memory array.

Fuse banks 10-15 are disposed at a portion of the chip separate from the memory arrays. Each fuse bank contains sixty four sets of fuses. Each fuse set includes 18 fuses. The fuse downloader 20 decodes information from a selected set of fuses and provides corresponding control signals along the data/control lines 30 to the redundant decoders. Any fuse set can be used to store the redundant address information for any redundant decoder. Studies have shown that if a high percentage of the redundant elements are invoked, the chances are high that the chip will have too many fails to fix by redundancy. Thus, by use of the invention, there can be more redundant decoders than fuse sets, decreasing the area overhead of the redundancy system. Moreover, if a particular fuse set is faulty, another fuse set can replace it. Thus, the invention reduces the negative effect on yield resulting from faulty redundancy operations, without compromising the overall fault tolerance of the memory system.

The 18 fuses of each fuse bank are allocated as follows:

Fuse 0—Enable Fuse Set (single fuse indicating that this particular set of fuses has been programmed).

Fuses 1-4—Select Array ( fuses that specify the addresses of up to 16 arrays within the memory chip).

Fuses 5-7—Select Redundant Element (each memory array has four redundant word lines and four redundant bit lines; these fuses indicate which redundant element is to be implemented within the selected array).

Fuses 8-16—Redundant Address (9-bit address of the faulty row or column that the redundant element is to replace).

Fuse 17-18—Disable Fuse Set (single fuse indicating that this particular set of fuses contains faulty information and is to be ignored).

Obviously, both the number and the information contained within the fuses can be varied as a function of the particular organization/architecture of the memory chip in which the invention is used. For example, if a smaller number of arrays are formed, less fuses may be needed to indicate the array in which the redundant element resides. Similarly, if each array has more redundant elements, more fuses may be needed to provide redundant element selection. The number of fuses to store the address of the faulty row/column obviously varies as a function of the density/address protocol of the memory chip.

Figure 2:
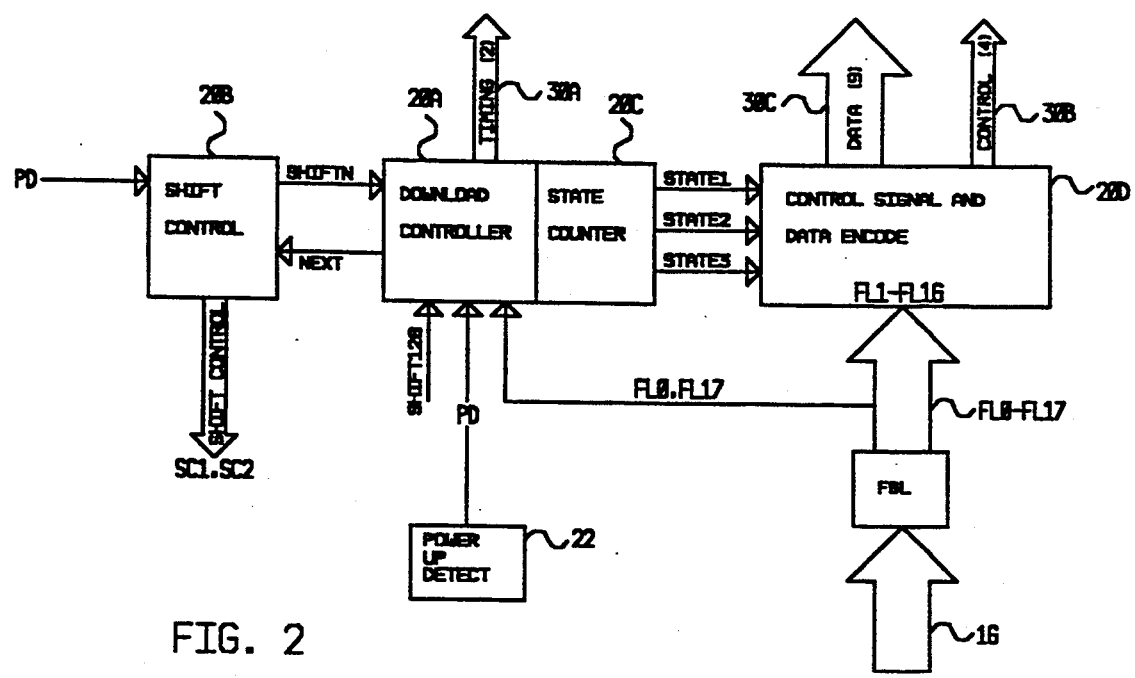
FIG. 2 is a block diagram of the fuse download system of the invention.

With reference to FIG. 2, the fuse download system 20 consists of download control and timing 20A, shift control 20B, state counter 20C, and control signal and data encoder 20D. As will be described in more detail below, the shift control 20B is used to access the fuse sets within fuse banks 10, 15 when the chip is powered up. The download controller 20A cycles the state controller 20C, which provides three enable signals STATE1-STATE3. When the first enable signal STATE1 rises, the encoder 20D produces address signals to select the redundancy system within one of the memory arrays. When the second enable signal STATE2 rises, the encoder 20D produces address signals to select one of the redundant elements within the selected memory array and sends the address of the faulty row/column. Finally, when the third enable signal STATE3 rises, the memory array is deselected. Then the next set of fuses are accessed, and the cycle is repeated.

The fuse download operation is initiated by a signal from the power-up detect circuit 22. That is, the fuses are downloaded when the chip receives an indication that it will be accessed for read/write operations. This indication can be from any one of a number of known memory chip power-up detect circuit implementations. For example, power-up can be indicated by the chip receiving a given number of Enable pulses, or by receiving an applicable initial program load (IPL) code from the control processor. When power up is detected, signal PD rises. This signal is supplied to the input circuit of download control 20A and to the shift control 20B. In response to PD rising, the control produces non-overlapping pulses SC1, SC2 which operate a shift register.

Figure 3:
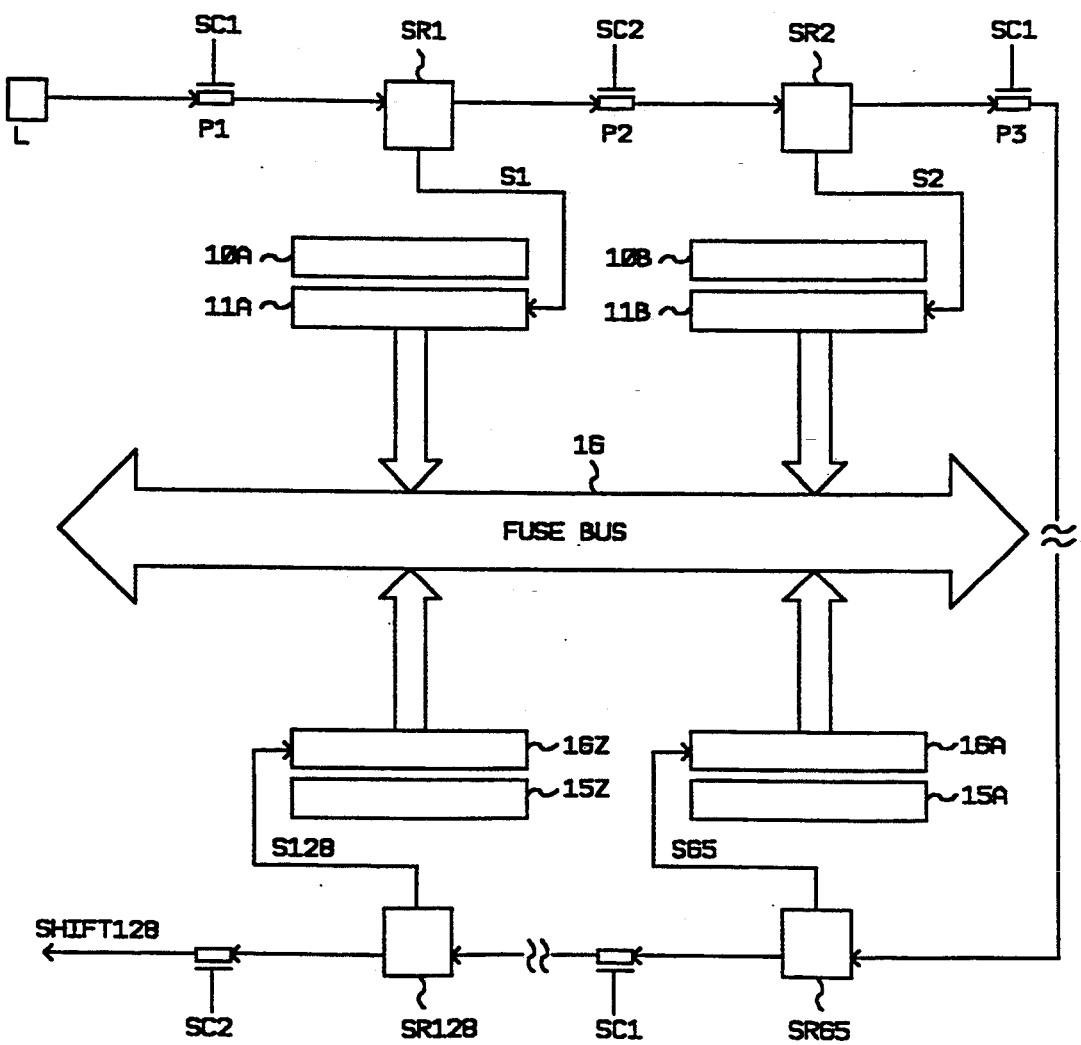
FIG. 3 is a block diagram of the fuse bank selection scheme of the invention.

FIG. 3 shows a block diagram of the fuse bank selection system. Fuse sets 10A, 10B are disposed within fuse bank 10 of FIG. 1. The fuses are connected through a set of NFET transfer devices 11A, 11B, respectively to the fuse bus 16. The transfer gates are controlled by the signals S1, S2 from shift registers SR1, SR2, respectively. When signal SC1 rises, NFET pass devices P1, P3 turn on, enabling the shift registers to serially pass a "1" bit to enable the associated transfer gates. At the start of the cycle, latch L stores a "1" bit, and all of the other shift registers store a "0". When the first SC pulse is triggered by shift control 20B when PD rises to indicate the start of chip operations, pass devices P1, P3 turn on, and the "1" bit is shifted from latch L to the first shift register SR1. When register SR1 latches the "1" bit, it produces a high signal S1 which turns on all of the transfer gates 11A associated with the first fuse set 10A (the transfer gates work the same way as pass devices P1-P3). Fuse bus 16 is 18 bits wide; each fuse within fuse set 10A is coupled to an associated line within fuse bus 16 when transfer gates 11A are enabled. The fuse bus lines are precharged high. If a fuse is blown, the associated line within fuse bus 16 will stay high. If a fuse is not blown, a discharge path to ground is established when the transfer gates turn on, such that the associated line is discharged to ground. Thus, the first SC pulse from shift controller 20B causes the fuse bus 16 to be loaded with the logic states stored in the first fuse set 10A from fuse bank 10.

With reference to FIG. 2, the logic states of fuse bus 16 are latched by latches FBL coupled to the fuse bus. The latches store the logic states for the remainder of the download cycle. The latched signals FL0 and FL17 (representing the logic states of fuses F0 and F17 from fuse bus 16) are sent to the input circuit of the download controller 20A. The latched signals FL1–FL16 (representing the logic states of fuses F1–F16 from fuse bus 16) are sent to the data encoder 20D.

Shift control SC then produces a low signal SHIFTN which indicates that the fuses have been downloaded and latched by the latches FBL. SHIFTN is produced by a delay circuit that receives SC as an input. The delay circuit consists of a plurality of serially-connected CMOS inverters, where the number of inverters and the size of the transistor devices provides a delay that tracks the amount of time it takes for the fuse selection (FIG. 2) and fuse bus latches FBL to operate. SHIFTN is sent to the download controller 20A. An alternative to this static delay circuit is to monitor the outputs of the latches FBL. When the states stored by the latches change, we know that a new set of fuses has been latched.

Figure 4:
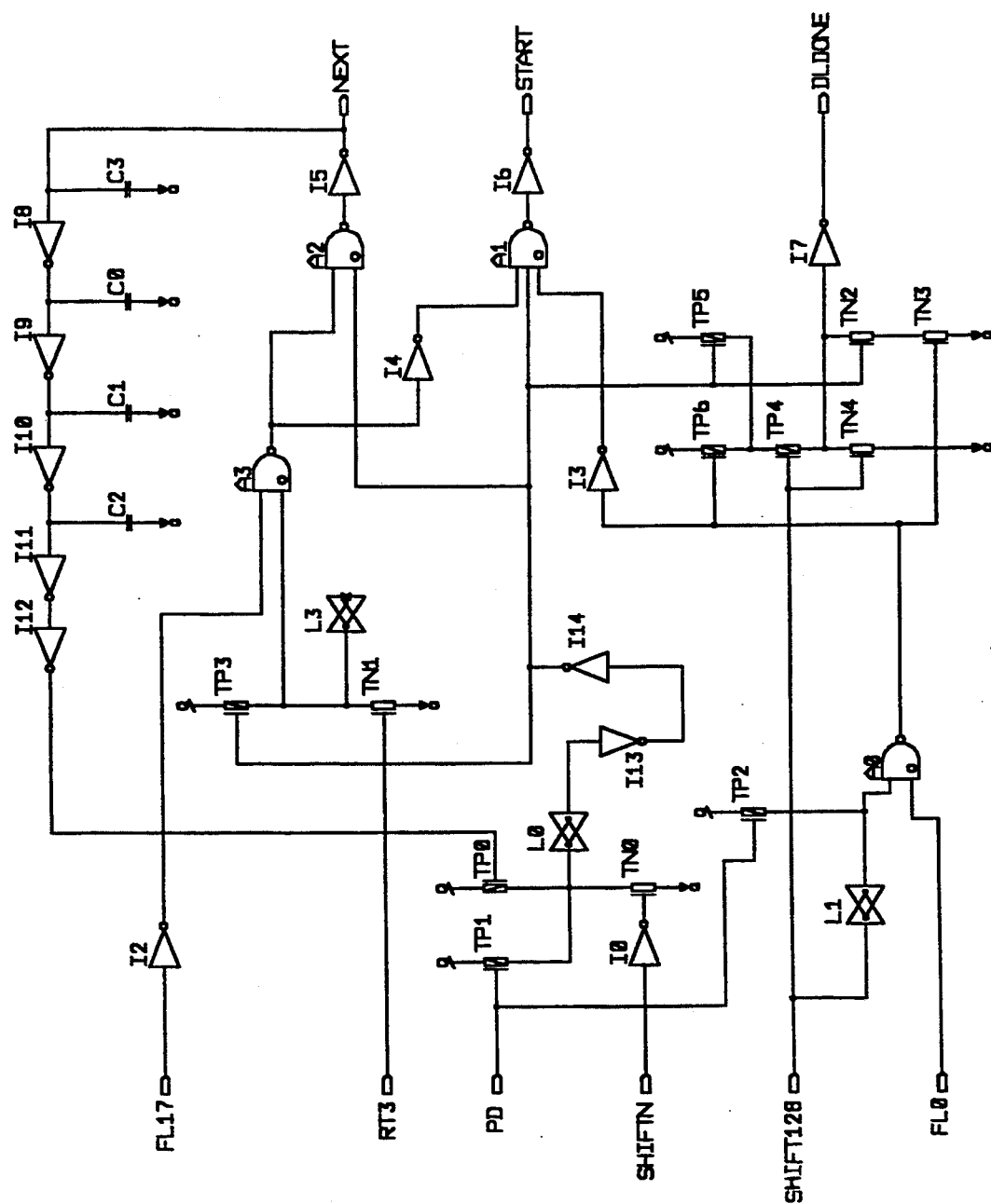
FIG. 4 is a circuit diagram of the input circuit of the download controller 20A of the fuse download system of FIG. 3.

FIG. 4 is a detailed diagram of the input circuitry of the download controller 20A. At the start of the cycle signal PD is low, such that inverting latch L1 is low. When PD rises upon chip power up, L1 is disconnected from Vdd. Subsequently, the SHIFTN line goes low, indicating that the fuse values have been latched. This causes inverting latch L1 to go high, such that a high signal is supplied via inverters I13, I14 to the NAND gate A1. At the same time, the circuit monitors the FL0 signal from the first fuse F0 to see if the accessed fuse bank has been programmed. If it has been programmed, the fuse will be blown and FL0 will be high. If FL0 is high, NAND gate A0 will go low, providing a high input to NAND gate A1. The circuit also monitors the FL17 signal from fuse F17. If the accessed fuse set is faulty, fuse F17 will be blown. If F17 is not blown, signal FL17 will be low, setting NAND gate A3 low so that NAND gate A1 receives a high signal from inverter I4. Thus, if the fuse valves have been latched, and if the accessed fuse set has been programmed without fault, NAND gate A1 will fall, such that the START signal rises via inverter I6. The START signal indicates that the fuse download sequence should continue.

If fuse F0 is not blown, the accessed fuse set has not been programmed. If fuse F17 is blown, the accessed fuse set contained faulty information. In this case, the next set of fuses should be accessed. If F0 is not blown, FL0 will be low. This will keep NAND gate A0 high, which will turn on NFET TN3. Since the signal from I4 is also high, NFET TN4 will also be on. Thus, the input to I7 will be grounded through TN2 and TN3, raising signal DLDONE to indicate that the download sequence has been completed. If F17 is blown, FL17 will be high, which will keep NAND gate A3 on. As a result, NAND gate A2 will provide a "0" output (recall the output of I14 went high when the SHIFTN signal went low), which produces a high signal NEXT that is sent to the shift control circuit 20B to strobe the SC signal to access the next fuse set.

Figure 5:
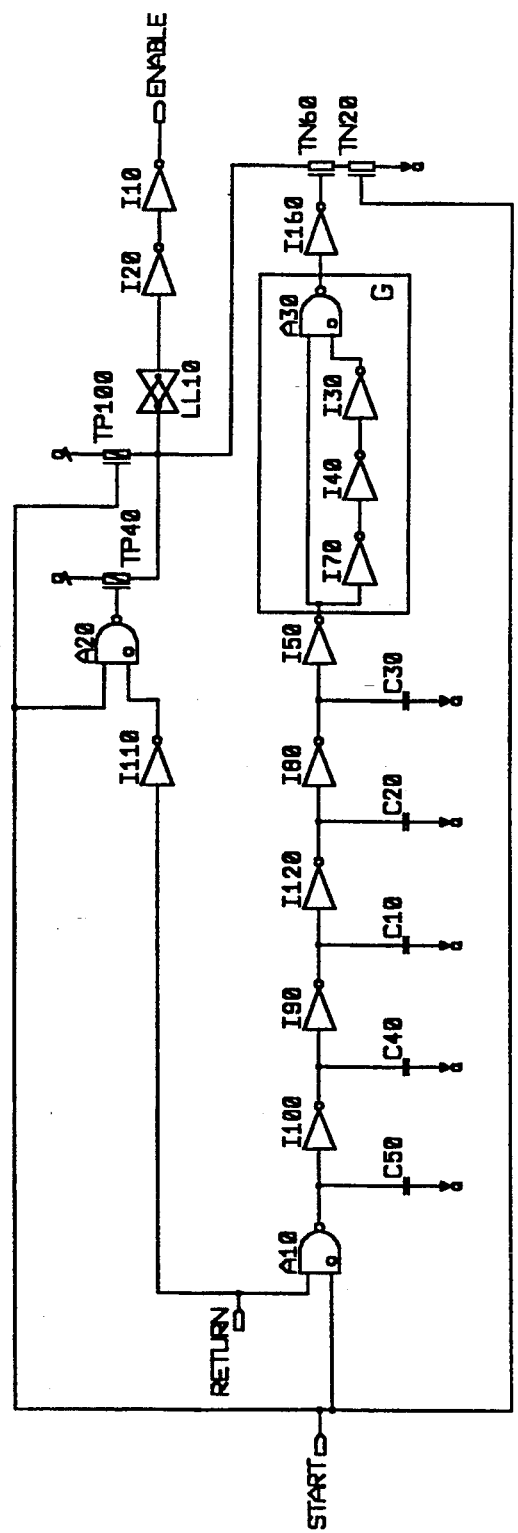
FIG. 5 is a circuit diagram of the output circuit of the download controller 20A of the fuse download system of FIG. 3.

With reference to FIG. 5, the START signal is received by the output circuit of the download controller 20A. While START is low, PFET TP100 is on, setting the output of inverting latch L10 low. When START rises, device TP100 turns off. At the same time, START is delayed and inverted through I50, I80–I100, I120 to rising edge detect circuit G which produces a low going pulse of minimal duration. I160 inverts this and sets Latch 10 with its output high causing ENABLE to rise.

Figure 6:
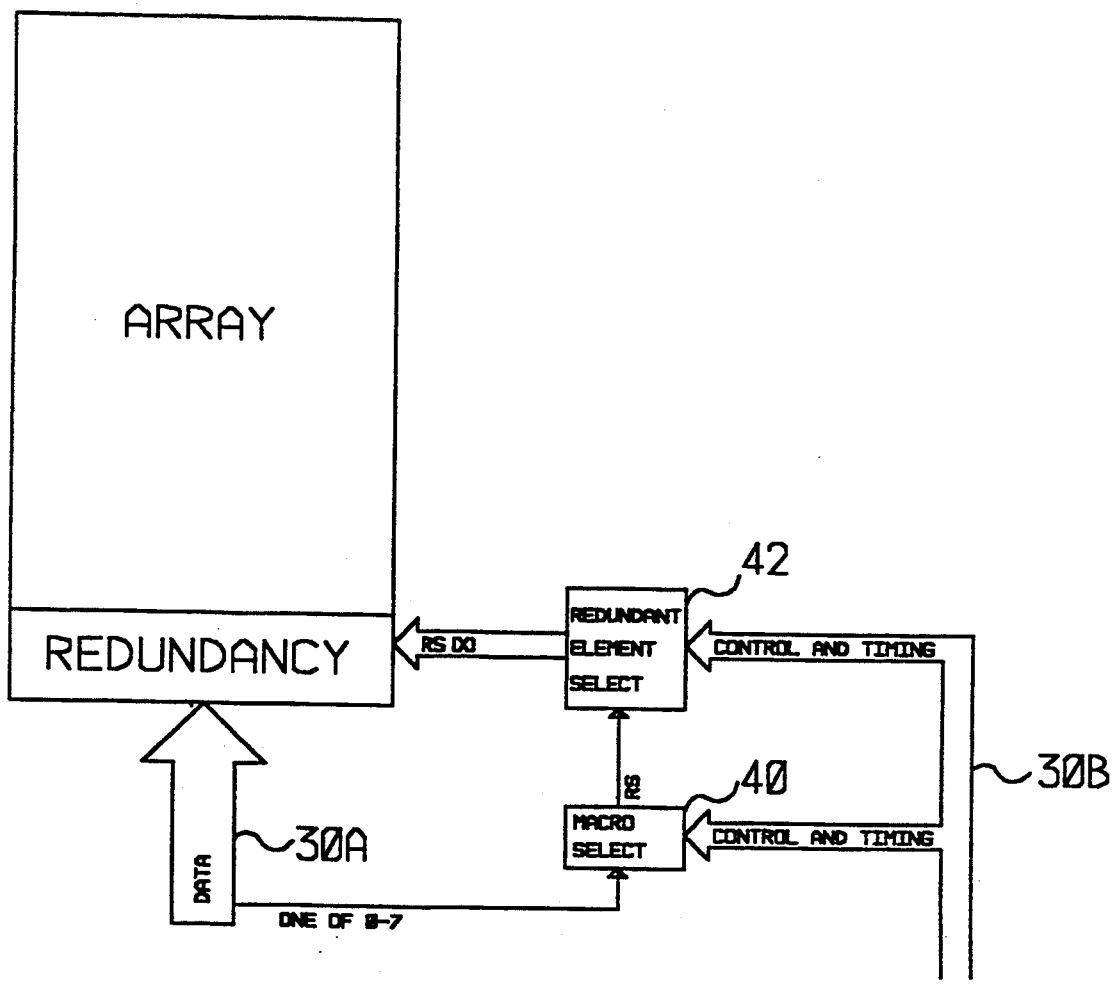
FIG. 6 is a block diagram of the redundant decoder select system of the invention.

The high-going ENABLE signal triggers the operation of the state counter 20C. The state counter 20C is a simple serial shift register constructed in a manner similar to the registers SR1, SR2 and pass devices P1–P3 of FIG. 2. When it receives the first ENABLE pulse, the STATE1 output of the state counter goes high. The rising STATE1 output causes the data encoder, 20D to begin operation. During the STATE1 cycle, fuses F1–F4 are accessed to determine which array on the chip has the redundant element that is to receive the address of the faulty memory row/column stored by this particular fuse set. The FC1–FC4 signals are encoded and sent on the control bus lines 30B and the data bus lines 30A to all of the arrays. With reference to FIG. 6, each array includes a standard NOR decoder MACRO SELECT 40. The MACRO SELECT decoders provide a 1-of-16 decode as a function of the encoded signals derived from the fuses, such that one of the MACRO SELECTS 40 will enable all of the redundant decoders 42 within the selected array, by producing an enable signal RS.

At the same time the FL1–FL4 signals are transmitted along control bus lines 30C to the arrays, the ENABLE signal from the output circuit of the download controller 20A is sent along a timing bus 30C to a circuit that simulates the transmission delay of the bus lines. That is, the ENABLE signal is received by a series of inverter stages that simulate the worst-case signal propagation delay (i.e., from initial signal generation along the bus lines to receipt of full logic levels by the last redundant decoder in the array furthest away from the fuse downloader) of the control bus 30B. When the ENABLE signal propagates through the transmission delay simulator to the output, the RETURN signal falls to indicate that the array has been selected. With reference to FIG. 5, RETURN falling causes A10 to rise which conditions the input to the rising edge defect circuit G. Also, RETURN is inverted through I110 and causes A20 to fall. This sets latch LL10 through TP40 and causes ENABLE to fall. ENABLE falling causes signal RETURN to be charged high again (not shown). RETURN falling also causes the STATE Counter to increment to STATE2.

When STATE2 is high, the logic states of fuses F5–F7 are sent along the control bus lines 30B to the memory arrays. With reference to FIG. 6, only one REDUNDANT ELEMENT SELECT block 42 will be enabled by virtue of the decoding during the STATE1 cycle. The FL5–FL7 signals indicate which redundant decoder within the selected array is to be programmed. Similarly to the MACRO SELECTS, the decoder select 42 consists of a series of NOR decoders. As a function of the FL5–FL7 signals, one of these decoders will be selected, to produce a unique signal RS(X) that enables a particular redundant decoder within the array previously selected in the STATE1 cycle. At the same time this is happening, the download controller 20A provides a signal on timing bus 30A to circuitry that simulates the worst-case delay associated with the redundancy element selection operation. Similarly to STATE1, this circuitry produces return signal that resets the ENABLE signal in the download controller (FIG. 5), causing the state counter 20C to disable the STATE2 signal and enable the STATE3 signal.

Figure 7:
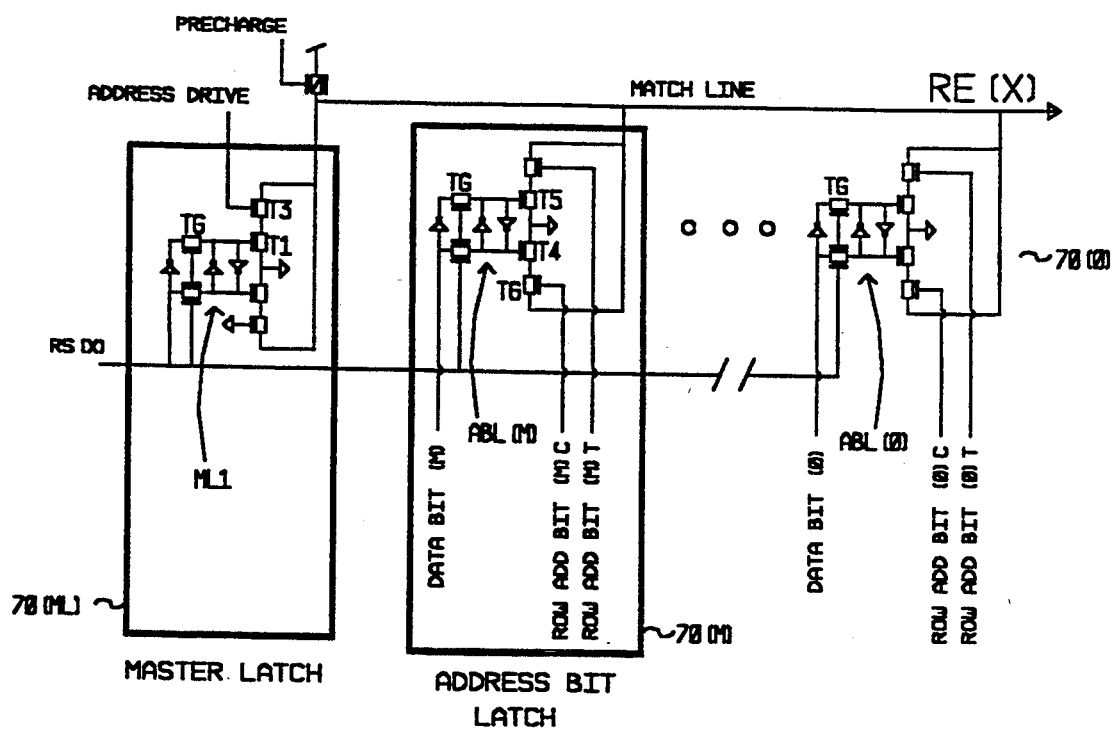
FIG. 7 is a circuit diagram of the redundant address decoders of the invention.

FIG. 7 is an illustration of a redundant decoder which produces a redundancy enable signal RE(X) to enable a redundant word line X. The decoder consists of a plurality of address bit latches 70(0)–70(M) and a master latch 70(ML). During the STATE2 cycle, the data encoder 20D transmits signals FL8–FL16 along the data bus portion 30C of the data/control bus 30. While these signals are sent to all of the arrays, only the selected redundant decoder is enabled by the RS(X) signal. Each of the address bit latches receive data bits 0–M corresponding to the fuse data from fuses F8–F16, respectively (in FIG. 7, only the first and last address bit latches, 70(0) and 70(M), which receive data bits 0 and M, respectively, are shown, for the purpose of clarity).

Each redundant decoder has a master latch 70(ML) which enables the decoder. The master latch receives RS(X) as both an enable and data signal. Within the master latch, RS(X) is inverted and passed by the transmission gates TG(NFETs having gates coupled to RS(X)) to the inverting latch ML1 made up of two cross-coupled CMOS inverters. There the data bit is latched low, turning off NFET T1 coupled to ground.

As the fuse address data FL8–FL16 is received by the ADDRESS BIT LATCH portions of the redundant decoder, the signals are latched in the same manner as the MASTER LATCH described above, such that the incoming fuse data is stored within latches ABL(-M)–ABC(0) of the address bit latches for the remaining time the chip is powered up. For the remainder of active chip operations, each ADDRESS BIT LATCH carries out a comparison between the latched fuse data and the incoming address data (in this case, row address bits). For example, assume fuse F15 is blown such that the incoming data bit M is high. This would result in NFETs T4 being on and T5 being off. If the incoming row address is the same as the fused address, row address bit (M) C will be low and row address bit (M)T will be high. With bit (M)C low, NFET T6 will be off. With both T4 and T6 off, there is no path from the MATCH LINE to ground, such that the line will remain high. This same operation is carried out for all the other latches. Thus, if all of the incoming address bits are the same as the fused address, the MATCH LINE will remain high. Thus, signal RE(X) will enable the redundant word line X.

With reference to FIG. 2, at the same time fuse data FL8–FL16 is sent to the arrays, another control signal is sent from downloader control 20A to a load circuit that simulates both the transmission path to the furthest array and the signal delays inherent in the operation of the cross-coupled latches within the address/master latches of the redundant decoders. The load circuit produces a return signal which increments the state counter 20C. The state counter will then produce "RT3" which is received by the input circuit of the downloader control 20A. As shown in FIG. 4, the RT3 signal resets latch L3 low, which drives the output of NAND A3 high, which (via NAND A2 and inverter I5) causes signal NEXT to rise. As shown in FIG. 2, the NEXT signal is sent to the shift control 20B to cause it to strobe the SC signal to access the next set of fuses. Returning to FIG. 4, at the same time RT3 causes NEXT to rise, it also causes the start output to fall because the NAND gate A3 causes one of the inputs to NAND A1 to go low. NEXT rising also causes latch L1 to reset via the delay path I8–I12. As shown in FIG. 5, when start falls the ENABLE output goes low, which turns off all of the outputs from state counter 20C. The system is now ready to download the next set of fuses.

This process continues until all of the enable fuse sets are accessed. With reference to FIG. 3, when the next SC pulse rises after fuse set 16Z of fuse bank 15 has been accessed, the passed bit provides an output signal SHIFT128 indicating that the last fuse set has been downloaded. As shown in FIG. 4, the high SHIFT128 signal flips the inverting latch L2, which causes the output of NAND gate A0 to rise, which couples the input of I7 to ground through NFETS TN2, TN3. This produces a high signal DLDONE, which is sent to internal logic within the memory to indicate that the entire fuse download operation has been completed and the memory to indicate that the entire fuse download operation has been completed and the memory is ready to carry out read/write operations.

Thus, at the completion of the fuse download operation, all of the redundant information has been programmed into the redundant decoders prior to chip operations. By use of this system, if a given fuse bank fails, another fuse bank can be used to program the redundant decoder. In the prior art methods of having one assigned fuse bank for each redundant element, if the fuses associated with the redundant element failed, that redundant element would be lost. Similarly, if a given redundant row/column of cells fails prior to fuse programming, the bank of fuses to be associated with it can be used to represent the redundancy information of another redundant row/column. As a practical matter, this means that less fuse banks are needed to support a given number of redundant elements, particularly as the manufacturing process matures and less defects are experienced. In other words, over time the chip could be made smaller by using less fuse banks, while still providing comprehensive fault coverage.

Moreover, in the invention the multiplexed redundant bus minimizes the silicon area associated with the fuse download operation. As the number of redundant elements increases, so do the number of address bits to be programmed in the redundant decoders. Furthermore, as the number of arrays and redundant elements associated therewith increases, so do the number of selection signals needed to assign a given fuse bank to a given redundant decoder. Without multiplexing, the size of the redundancy bus will greatly increase with each generation, producing a silicon overhead that becomes unattractive. Obviously, if there is a need to make the bus a small as possible, the extent of multiplexing could be increased; however, increased multiplexing would increase the total cycle time of the fuse download operation, which in some applications could also be unattractive. In the invention, an optimal tradeoff is presented by introducing limited multiplexing.

Finally, in prior art systems information is obtained from the fuses during each cycle of memory operation. In the invention, the redundant decoders are loaded prior to active chip operations. Thus, the invention reduces the access delays produced by the redundancy system during active cycles.

Although the invention has been described with reference to a particular mode of operation/construction, various modifications can be made to the foregoing teachings without departing from the spirit and scope of the invention.

What is claimed is:

1. In an integrated circuit comprising a plurality of circuit elements, some of which may be faulty, which respond to a discrete set of access signals, and a plurality of redundant elements that are programmed to respond to said discrete set of access signals to substitute for faulty ones of said plurality of circuit elements, a redundancy programming method comprising the steps of:
   testing said integrated circuit to determine which of said plurality of circuit elements are faulty;
   programming a plurality of sets of non-volatile storage elements, such that at least some of said plurality of sets of non-volatile storage elements store a first plurality of signals that simulate the discrete set of access signals corresponding to a faulty one of said plurality of circuit elements and a second plurality of signals indicating a selected one of said plurality of redundant elements to be substituted for said faulty one of said plurality of circuit elements; and
   sequentially downloading programmed ones of said plurality of sets of non-volatile storage elements to set selected ones of said plurality of redundant elements to substitute for faulty ones of said plurality of circuit elements when said discrete set of access signals for faulty ones of said plurality of circuit elements are received.

2. A redundancy system for a memory chip having a plurality of rows of memory cells, comprising:
   a plurality of rows of redundant memory cells;
   a plurality of sets of fuses, each set of fuses including a first plurality of fuses storing logic states for selecting one of said plurality of rows of redundant memory cells, and a second plurality of fuses storing logic states indicating a faulty one of said plurality of rows of memory cells; and
   a fuse downloader for sequentially accessing each of said plurality of sets of fuses, wherein during accessing of a given one of said plurality of sets of fuses said first and second plurality of fuses are accessed serially.

3. The redundancy system of claim 2, wherein each of said plurality of sets of fuses further includes a fuse indicating that the particular set of fuses has been programmed.

4. The redundancy system of claim 3, wherein each of said plurality of sets of fuses further includes a second fuse indicating that the particular set of fuses is faulty.

5. The redundancy system of claim 4, wherein said fuse downloader includes means to bypass further accessing of a given one of said plurality of sets of fuses should either of its first or second fuses indicate that access should be discontinued.

6. The redundancy system of claim 2, wherein said plurality of rows of redundant memory cells is greater in number than said plurality of sets of fuses.

7. The redundancy system of claim 2, wherein said plurality of rows of redundant elements are arranged into groups, and wherein said first plurality of fuses includes a first subset of fuses which store logic signals that select which group of said plurality of rows of redundant elements, and a second subset of fuses which store logic signals that select one of said plurality of rows of redundant elements within said selected group.

8. The redundancy system of claim 7, wherein said fuse downloader accesses and first subset of fuses in a first fuse download cycle, said second subset of fuses in a second fuse download cycle, and said second plurality of fuses in a third fuse download cycle.

9. The redundancy system of claim 2, further comprising a data/control bus coupled between said fuse downloader and said plurality, of rows of redundant memory cells.

10. The redundancy system of claim 9, wherein during access of a given one of said plurality of sets of fuses, logic states from said first plurality of fuses are transmitted on a control portion of said data/control bus, anal logic states from said second plurality of fuses are transmitted on a data portion of said bus separate from said control portion of said bus.

11. In an integrated circuit having a plurality of functional circuit elements, at least one of which may be faulty, and a plurality of redundant circuit elements, a redundancy system comprising:
   a plurality of redundant decoders, each of which enables a corresponding one of said plurality of redundant circuit elements;
   storage means for storing first information identifying which of said functional circuit elements is faulty and for storing second information identifying which of said plurality of redundant circuit elements is to be substituted for said faulty one of said functional circuit elements, said storage means comprising a plurality of sets of nonvolatile storage elements, at least some of said plurality of sets being programmed, each of said programmed sets storing said first and second information and also storing third information indicating whether said first and second programmed set is faulty; said storage means further including: a first means for serially accessing all of said plurality of sets of non-volatile storage elements, a second means for bussing information from each of said plurality of sets of nonvolatile storage elements accessed by said first means to said plurality of rows of redundant memory cells, and a third means for controlling said second means so that when a given one of said plurality of sets of nonvolatile storage elements is accessed, signals from said first group of storage elements is transmitted on said second means during a first download cycle, and signals from said second group of storage elements are accessed during a second download cycle;
   said second information enabling a selected one of said plurality of redundant decoders and said first information causing said enabled redundant decoder to activate said corresponding one of said plurality of redundant circuit elements when said faulty one of said plurality of functional circuit elements is selected for activation.

* * * * *